(12) United States Patent
Lindstrom et al.

(10) Patent No.: US 8,063,997 B2
(45) Date of Patent: *Nov. 22, 2011

(54) INTEGRATED PROGRAMMABLE TUNER

(75) Inventors: Mats Lindstrom, San Diego, CA (US);
Glenn W. Eswein, Branchburg, NJ (US);
Abdolreza Shafie, San Diego, CA (US);
Mike A. Ploof, San Diego, CA (US);
Ryuji Maeda, San Diego, CA (US);
Manjit S. Gill, San Diego, CA (US);
Eileen Carlson, San Diego, CA (US);
Anthony R. Simon, San Jose, CA (US);
Henry S. Lau, Lexington, MA (US)

(73) Assignee: NXP B.V., Eindhoven (NL)

( * ) Notice: Subject to any disclaimer, the term of this patent is extended or adjusted under 35 U.S.C. 154(b) by 154 days.

This patent is subject to a terminal disclaimer.

(21) Appl. No.: 12/186,491

(22) Filed: Aug. 5, 2008
(Under 37 CFR 1.47)

(65) Prior Publication Data
US 2009/0096935 A1    Apr. 16, 2009

Related U.S. Application Data

(63) Continuation of application No. 10/210,591, filed on Jul. 31, 2002, now Pat. No. 7,414,676.

(51) Int. Cl.
*H04N 5/50* (2006.01)
(52) U.S. Cl. ..... 348/731; 348/725; 348/151; 455/189.1; 455/194.2; 455/191.3; 455/241.1; 455/251.1
(58) Field of Classification Search .................. 348/725, 348/726, 731, 733, 555, 556, 558; 725/151; 455/189.1, 160.1, 245.1, 190.1, 194.1, 194.2, 455/191.3, 234.1, 241.1, 252.2, 343.1, 334
See application file for complete search history.

(56) References Cited

U.S. PATENT DOCUMENTS

| 6,353,463 B1 * | 3/2002 | Seo ............................... 348/731 |
| 6,725,463 B1 * | 4/2004 | Birleson ........................ 725/151 |
| 7,317,493 B1 * | 1/2008 | Hutchinson et al. .......... 348/678 |
| 7,414,676 B2 * | 8/2008 | Lindstrom et al. ............. 348/731 |

FOREIGN PATENT DOCUMENTS

JP        11055140 A   *  2/1999

* cited by examiner

*Primary Examiner* — Michael Lee

(57) ABSTRACT

An integrated tuner is programmable to optimize its components for either analog signal reception or digital signal reception. Power to the components is increased for analog operation and decreased for digital operation. The tuner also includes a selectable and integrated low noise amplifier that may be selected for single-signal reception and bypassed for multi-signal reception.

17 Claims, 5 Drawing Sheets

INTEGRATED PROGRAMMABLE TUNER

CROSS-REFERENCE TO RELATED APPLICATIONS

This application is a continuation of U.S. patent application Ser. No. 10/210,591, entitled "Integrated programmable tuner," filed on Jul. 31, 2002, now U.S. Pat. No. 7,414,676 which is incorporated by reference.

BACKGROUND OF THE INVENTION

1. Field of the Invention

The present invention relates to RF tuners and more particularly relates to programmable tuner circuits that are integrated on a single chip.

2. Background

Radio frequency (RF) tuners for receiving and interpreting broadband signals over coaxial cable have many applications. They are found in cable modems to allow high speed access to Internet data; in cable set top boxes and television receivers to allow a television to receive and decode digital television broadcasts as well as Internet data; in personal computers to provide multi-media capability; and in many other broadband cable access devices. In many of these and other applications, tuners are being called upon to receive and tune both analog and digital signals, and also to receive and tune multiple signals for concurrent display. A cable set top box, for example, may receive analog television signals and digital Internet data. Moreover, the set top box may be required to receive and tune these signals simultaneously.

Although a single tuner is often capable of receiving and tuning both analog and digital signals, it is usually not optimized for both types of signals. In a tuner employing a known superheterodyne "dual" or "double" conversion architecture, for example, more power is consumed for analog reception than for digital reception. Analog reception requires more power than digital reception because the tuner needs better linearity to maintain lower intermodulation distortion products. Digital reception has less stringent linearity requirements and hence consumes less power than does analog reception. Hence, when digital signals are received and tuned on a tuner optimized for analog operation, power is wasted.

Discrete "canned tuner" solutions have been proposed using a front-end tracking filter and a single conversion architecture to optimize the tuner for lower power consumption. The front-end tracking filter enhances the linearity of the tuner without significant power consumption. The linearity enhancement provided by the tracking filter is sufficient to support both analog and digital reception without a difference in power consumption. The disadvantage to this solution, of course, is that all tuner components are not integrated on a single IC. Alternative solutions provide separate, dedicated chips in the tuner for analog and digital reception.

A dual conversion tuner can be integrated on a single IC, which provides several advantages relative to a discrete single conversion tuner. These include better gain flatness over input frequency, a significantly lower external component count, no manual or automated tuning, and a cheaper tuner solution. A suitable solution has not been found, however, to optimize power consumption in a dual conversion tuner.

In addition to the challenge of mixed analog/digital operation, advanced receivers such as set top boxes and cable modems often require multiple tuners in order to simultaneously receive and support multiple types of broadband signals, such as a main video signal, cable modem Internet access, picture-in-picture, video-on-demand and so on. In a multi-tuner receiver, a single RF input (which may include multiple broadband signals) is split and provided to separate tuners. In this manner, each tuner can extract its desired signal from the RF input (i.e., main video, picture-in-picture, etc.) and the multiple signals may be displayed simultaneously if desired.

A typical multi-tuner receiver receives multiple signals at different frequencies on a single RF input. The input RF signal is amplified by a low noise amplifier (LNA) optimized for multi-tuner operation, and split among multiple paths to separate tuners that each tune and amplify a different band of the RF signal, permitting concurrent receipt and display of multiple signals. Since the front-end performance requirements for the individual tuners differ depending on application, a fully integrated tuner with fixed performance specifications is not practical.

Typically, the LNA in an integrated tuner design is either not integrated or not selectable. Where the LNA is not integrated, the LNA is chosen in order to optimize the particular receiver application. For instance, in a single signal reception environment an LNA with a certain specification is used, and in a multiple signal reception environment an LNA with a different specification is used. Where the LNA is integrated, conversely, it is not selectable. Hence, an LNA optimized for a single reception environment could not be bypassed in a multiple reception environment. Instead, a completely different tuner IC with a different LNA would be necessary. A tuner IC having an integrated and selectable LNA, capable of operating in both a single-tuner and multi-tuner environment, is highly desirable.

SUMMARY OF THE INVENTION

In one embodiment of the present invention, an integrated tuner is provided. The tuner comprises a plurality of tuner components that receive an input RF signal and convert the signal to an output intermediate frequency (IF) signal, and a mode controller connected to at least one of the tuner components. The mode controller optimizes the tuner components for analog operation when the input RF signal is an analog signal and for digital operation when the input RF signal is a digital signal. The tuner may be implemented in a cable set top box, a cable modem, a television receiver or in other receiver applications.

In another embodiment of the present invention, a method for optimizing an integrated tuner for reception of either analog or digital signals is provided. The method comprises the steps of detecting whether an input signal is an analog signal or a digital signal and, if the input signal is an analog signal, optimizing at least one of the components of the tuner for analog operation. If the input signal is a digital signal, at least one of the tuner components is optimized for digital operation.

In another embodiment of the invention, a receiver is provided. The receiver includes a single tuner input coupled to a tuner integrated on a single chip. The single tuner has a first LNA that receives the single tuner input. The receiver also includes a multi-tuner input coupled to a second LNA that is optimized for multi-tuner operation. The output of the second LNA is split into multiple path signals that are coupled to multiple tuners, and one of the multiple path signals is coupled to the output of the first LNA. A mode controller powers the first LNA on when a signal is present on the single-tuner input and powers the first LNA off when a signal is present on the multi-tuner input.

Another embodiment of the invention provides a method for using an integrated single tuner in conjunction with both single- and multi-tuner operation. First, it is determined whether a single-tuner or multi-tuner signal is present. If a single-tuner signal is present, an integrated LNA on the single tuner is powered on and the single-tuner signal is processed with the integrated single tuner. If a multi-tuner signal is present, the integrated LNA is powered off, the multi-tuner signal is amplified with an off-chip LNA, and the amplified signal is injected into the output path of the integrated LNA for processing with the integrated single tuner.

A programmable integrated tuner is also provided by the present invention. The programmable tuner comprises a plurality of components, one of which is an LNA. The LNA is programmable to power on for single-tuner signal reception and to power down for multi-tuner signal reception. The LNA is also programmable to operate at a relatively high power for analog signal inputs and at a relatively lower power for digital signal inputs.

In another embodiment of the present invention, a programmable integrated tuner comprises signal conversion means for receiving an input RF signal and converting it to an output IF signal, and mode controller means coupled to the signal conversion means for optimizing operation of the signal conversion means in response to the type of input RF signal that is received. In one implementation, the mode controller means increases power to the signal conversion means when the input RF signal is an analog signal and decreases power to the signal conversion means when the input RF signal is a digital signal.

In a further embodiment of the present invention, a method for optimizing operation of an integrated tuner that receives input RF signals of various types is provided. The method includes a step for determining what type of input RF signal is being received, and a step for allocating power to components of the integrated tuner based on the type of input RF signal that is received.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

Figure 1:
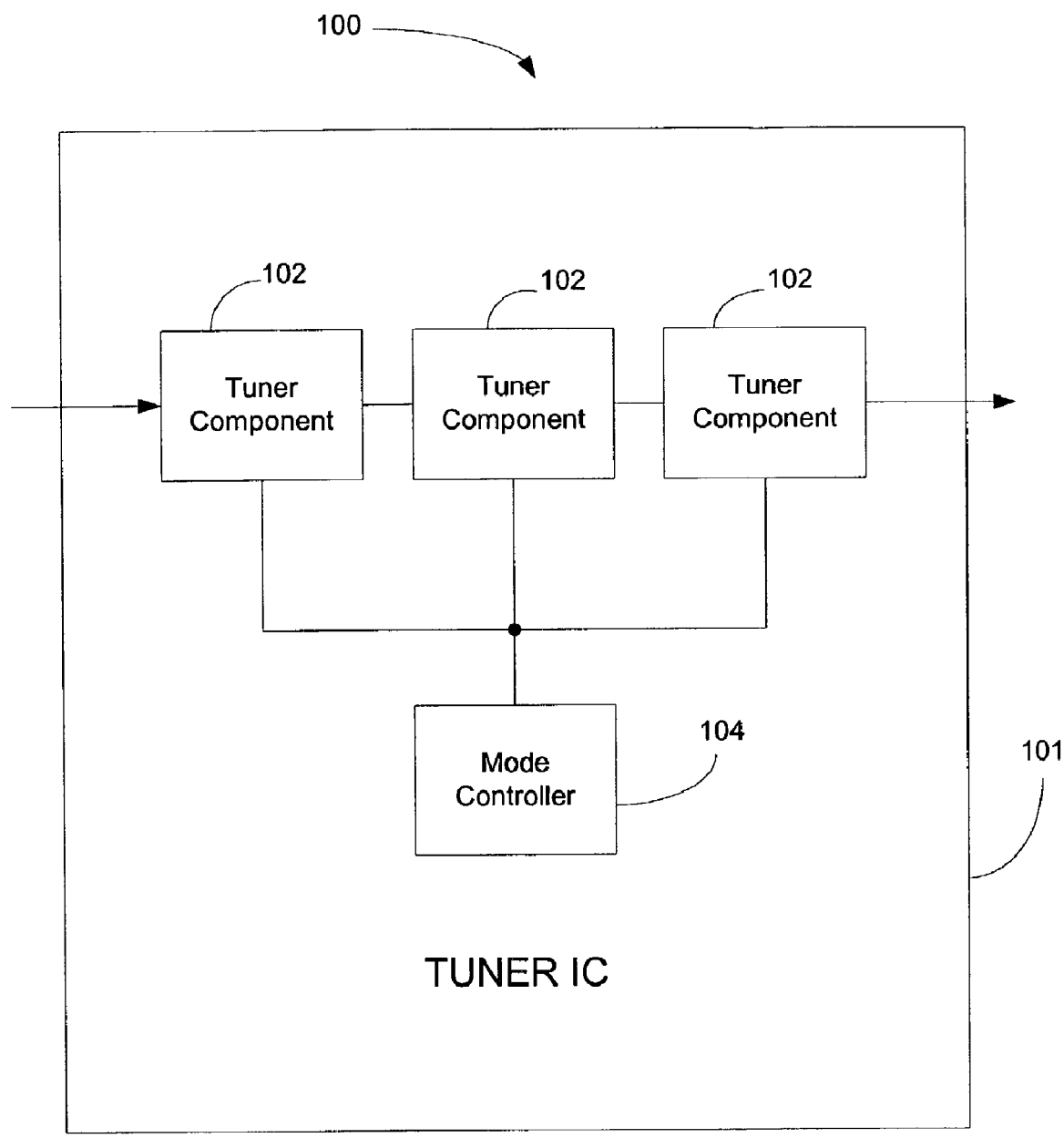
FIG. 1 is a block diagram illustrating an integrated tuner with a analog/digital mode controller according to the present invention.

FIG. 1 is a block diagram of a first embodiment of the present invention. Tuner 100 comprises a plurality of electrical components 102 for converting input RF signals to IF video and audio signals. Although three components 102 are shown, as will be described herein, a typical tuner will comprise more than three components. They are depicted only generally in FIG. 1 in order to illustrate the broad principles and applicability of the present invention. Tuner 100 may be contained in a cable set top box, cable modem, television, MMDS (microwave multi-point distribution system) transceiver. computer or any other component in which tuning of RF signals is desired. In one implementation, tuner 100 is integrated on a single semiconductor chip 101. Tuner 100 receives input RF signals from a cable line, antenna or other RF signal source. As will be described herein, the input signals may be digital or analog in form.

Tuner 100 also includes a mode controller 104 coupled to tuner components 102 for switching the components between a digital or data mode and an analog mode. Although mode control 104 is shown coupled to three components 102, it may be connected to only one, several or all components of tuner 100. It will typically be connected to those components having characteristics that may be optimized for either digital or analog signal reception. Optimization of these characteristics, which include linearity, noise figure, gain and other parameters, affects the power consumption of the tuner. As analog operation typically consumes more power than digital operation, mode controller 104 may also be thought of as switching between a relatively higher power mode and a relatively lower power mode.

Figure 2:
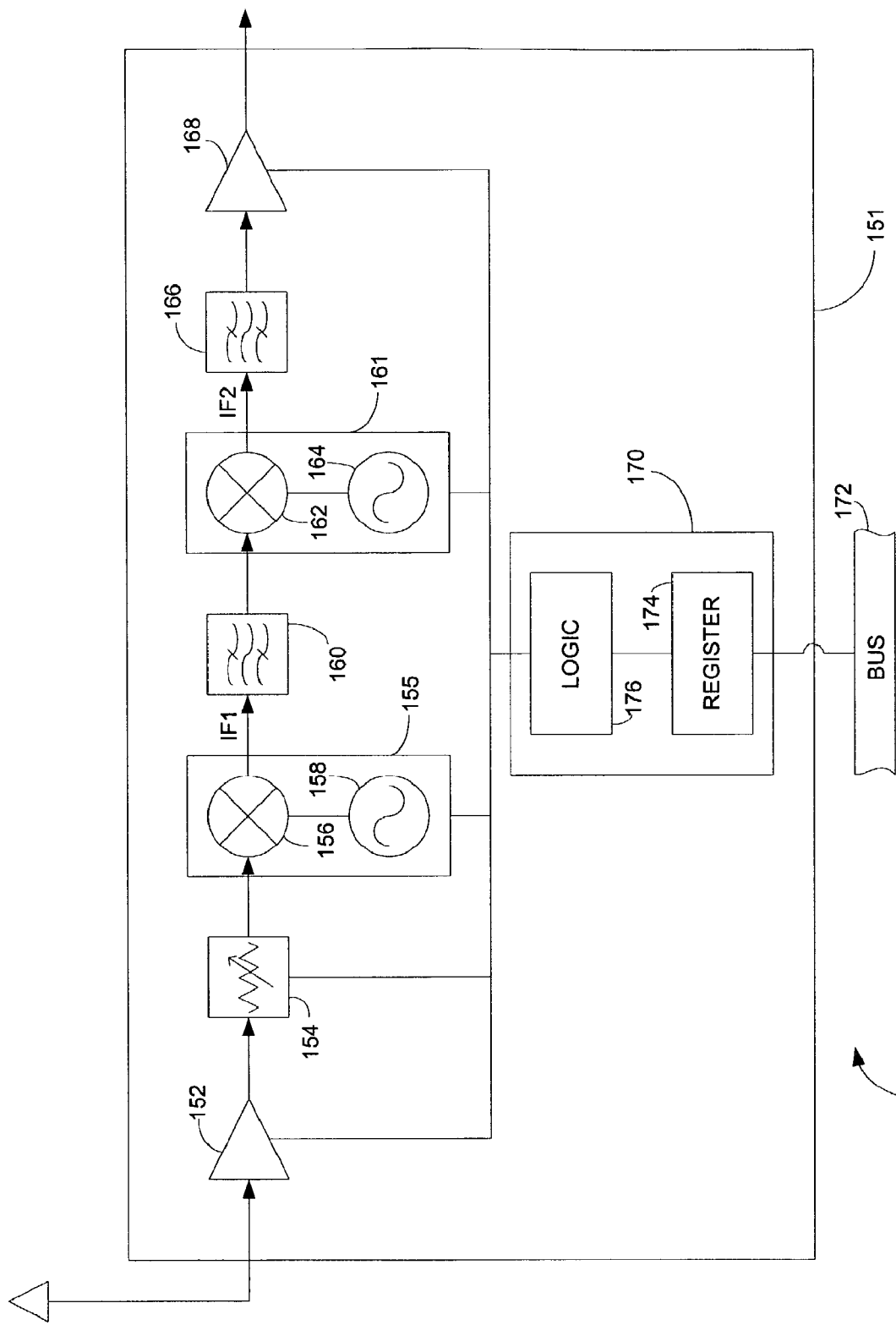
FIG. 2 is a schematic diagram illustrating an integrated dual conversion tuner having an analog/digital mode controller according to the present invention.

FIG. 2 illustrates a dual-conversion tuner 150 having digital/analog mode control according to the present invention. Tuner 150 is integrated on a single IC 151 that is functionally a single component or module mountable on a printed circuit board with its signal inputs and outputs coupled to the appropriate signal lines within the set top box, television, cable modem or other receiving system in which it is incorporated. Tuner 150 receives RF signals from an cable line, antenna or other RF receiving/transmitting medium or component. For cable/television broadcasts, for example, the signals will be in a range of approximately 50-850 MHz.

Low noise amplifier (LNA) 152 amplifies the received RF signal a fixed amount with minimal noise amplification. LNA 152 is coupled to RF attenuator 154. Attenuator 154 is a variable gain attenuator that sets signal gain based on the strength of the received signal. When signals are received on multiple channels or frequency bands, the strengths of the received signals may vary significantly. If a very strong signal is received, for example, signal gain is set to a lower level. As an alternative to a fixed gain amplifier in series with a variable gain attenuator, a variable gain amplifier could be used.

The output of attenuator 154 is coupled to first frequency conversion stage 155, comprising first mixer 156 and first local oscillator 158. Mixer 156 mixes the received signal with a signal from first local oscillator 158 to generate a signal at a first intermediate frequency (IF1). In one implementation, mixer 156 is an up-conversion mixer. Hence, in this implementation, signal IF1 output by mixer 156 is a higher frequency than the received signal input to mixer 156. Signal IF1 is coupled to first IF filter 160. Filter 160 is typically a band pass filter that provides coarse channel selection. The channel selection may be a band of channels or even a single channel.

The output of first IF filter 160 is provided to second frequency conversion stage 161, comprising second mixer 162 and second local oscillator 164. Mixer 162 mixes signal IF1 with a signal from second local oscillator 164 to generate a signal at a second intermediate frequency (IF2). In one implementation, second mixer 162 is a down-conversion mixer. The frequencies of the signals provided by local oscillators 158 and 164 will vary depending on the desired channel or frequency band. Signal IF2 is then coupled to a second IF filter 166. The output of filter 166 is passed to IF AGC amplifier 168, which further controls the overall tuner gain. The output of amplifier 168 is then subjected to further processing and/or filter in a known manner to provide IF audio and video signals.

Mode controller 170 is coupled to at least one component of tuner 150 for which optimization of a characteristic based on digital or analog operation is desired. As illustrated in FIG. 2, controller 170 is coupled to LNA 152, attenuator 154, first mixer 156, second mixer 162 and IF AGC amplifier 168. However, it should be appreciated that controller 170 could be coupled to only one of these components, some of these components or further components in addition to those shown.

Controller 170 is controlled by an off-chip computer, processor or software via an interface with bus 172, which may have a serial, parallel or other configuration. In one implementation, mode controller 170 includes internal registers 174 whose values can be updated via bus 172 dependent on whether analog or digital signals are being received. Logic circuitry 176 coupled to registers 174 switches the various components of tuner 150 between analog and digital modes of operation based on the values stored in registers 174. This is just one of the possible embodiments of a mode controller; other embodiments are possible and are within the scope of this invention.

Figure 4:
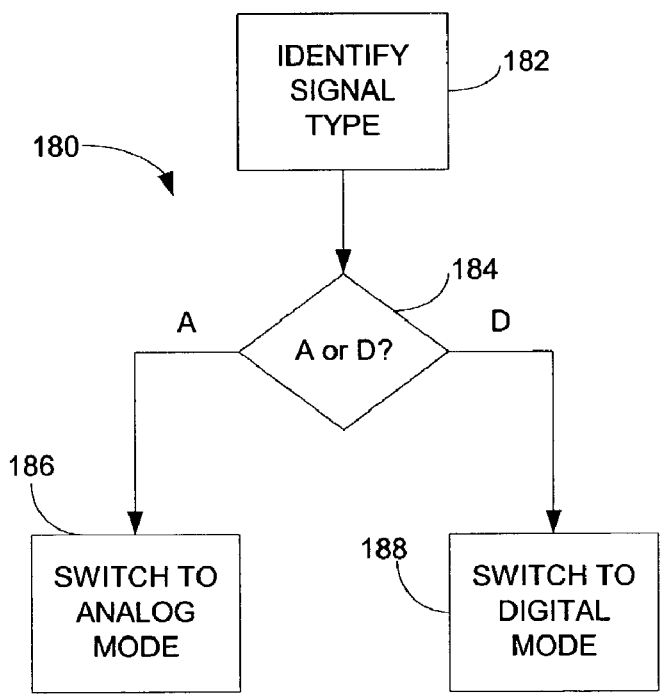
FIG. 4 is a flow chart illustrating a method for switching a tuner between analog and digital modes according to the present invention.

FIG. 4 illustrates a method 180 for switching a tuner between analog and digital modes according to the present invention. In step 182, the incoming signal type is identified. With reference to FIG. 2, step 182 is carried out by communication of the signal type (analog or digital) from bus 172 to mode controller 170, with values corresponding to either analog or digital operation being stored in register 174. If the signal is analog (step 184), mode controller 170 switches tuner 150 to analog mode (step 186). In carrying out step 186, logic circuitry 176 switches the various components of tuner 150 to an analog mode of operation by using the values stored in registers 174. If the signal is digital (step 184), mode controller 170 switches tuner 150 to digital mode (step 188). In carrying out step 188, logic circuitry 176 switches the various components of tuner 150 to a digital mode of operation by using the values stored in registers 174.

The components of tuner 150 are controlled by mode controller 170 in various ways to implement analog or digital operation. As described above, the operation of any number of the tuner components can be optimized for analog/digital operation. In addition to being optimized for either analog or digital operation, the tuner components may be further optimized for particular analog or digital formats or modulation schemes. For digital operation, for example, the tuner components may be further optimized for quadrature amplitude modulation (QAM), quaternary phase shift keying (QPSK), binary phase shift keying (BPSK) or other digital modulation schemes.

In one implementation, logic circuitry 176 controls the input bias current and voltage to attenuator 154 to optimize attenuator 154 for analog and digital modes of operation. For analog operation, higher signal-to-noise ratio (SNR), higher gain and higher linearity are required. To achieve this higher performance a correspondingly higher amount of power is required. Hence, for analog operation, logic circuitry 176 applies a higher bias current to attenuator 154. For digital operation, conversely, the SNR, gain and linearity requirements are lower, and the power requirements are also lower. Thus, for digital operation, logic circuitry 176 causes a lower bias current to be applied to attenuator 154. The bias current may be further manipulated to optimize for particular digital or analog modulation schemes.

Figure 3:
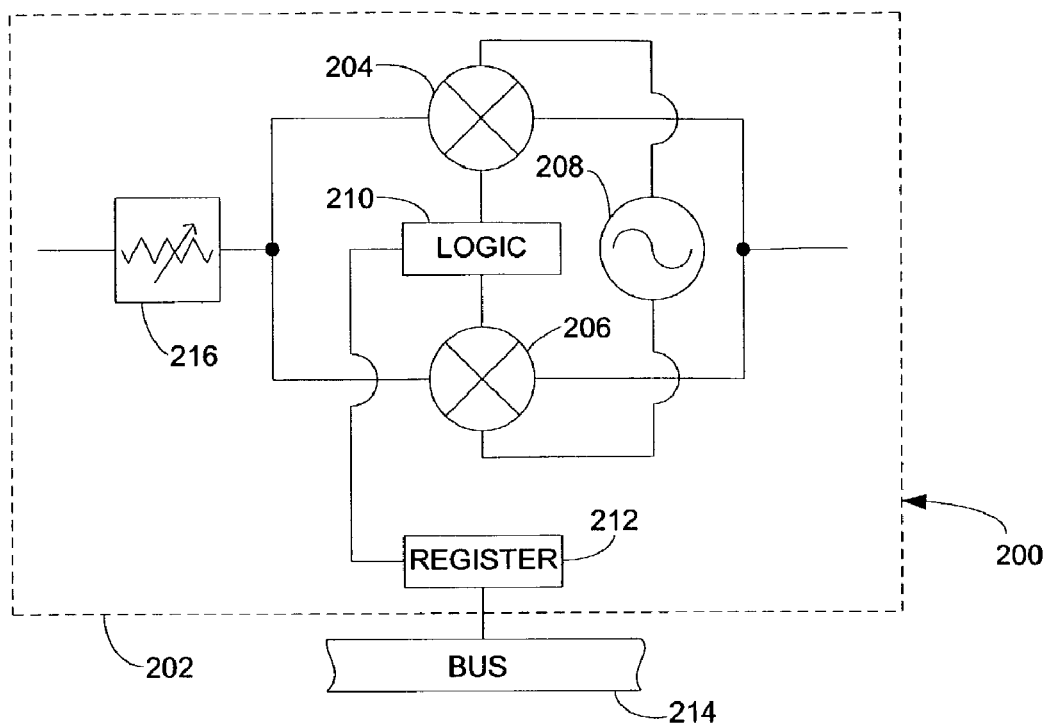
FIG. 3 is an exploded schematic diagram illustrating one component of the tuner of FIG. 2.

FIG. 3 illustrates one configuration by which the frequency conversion stages (i.e., stages 155 and 161 in FIG. 2) might be-optimized to implement analog and digital modes of operation. Frequency conversion stage 200 is integrated on a tuner IC 202, and could represent an up-conversion stage, a down-conversion stage or both. Only a portion of tuner IC 202 is illustrated; the entire tuner would be similar in configuration to tuner 150 of FIG. 2.

Frequency conversion stage 200 comprises two mixers 204 and 206, each coupled to a local oscillator 208. Mixer 204 is optimized for analog operation and mixer 206 is optimized for digital operation. Logic circuitry 210 is coupled to each of mixers 204 and 206 and powers one up and one down, depending on the mode of operation. Bus 214 loads the values of registers 212 with values corresponding to either analog or digital operation, and these values are retrieved by logic circuitry 210.

For analog operation, mixer 204 is powered on and mixer 206 is powered off by logic circuitry 210. Mixer 204 is configured to provide the higher signal-to-noise ratio (SNR), gain and linearity required for analog operation and hence consumes a higher amount of power. The incoming signal from attenuator 216 (which may also be connected to logic 210 for digital/analog optimization) is mixed with the signal from local oscillator 208 to generate a signal an IF frequency. For digital operation, mixer 206 is powered on and mixer 204 is powered off by logic circuitry 210. Mixer 206 is configured to provide the lower signal-to-noise ratio (SNR), gain and linearity required for digital operation and hence consumes a relatively less amount of power. The incoming signal from attenuator 216 (which may also be connected to logic 210 for digital/analog optimization) is mixed with the signal from local oscillator 208 to generate a signal at an IF frequency.

As an alternative to the switchable mixer configuration depicted in FIG. 3, optimization of the frequency conversion stage may be accomplished by using one mixer and varying the bias current input to the mixer. Hence the bias current would be increased for analog operation and decreased for digital operation.

Advanced cable television receivers, such as set top boxes, often require multiple tuners in order to simultaneously receive and support multiple types of broadband signals, such as a main video signal, cable modem Internet access, picture-in-picture, video-on-demand and so on. In one implementation known as a "multi-tuner", a single RF input (which may include multiple broadband signals) is split and provided to separate tuners. In this manner, each tuner can extract its desired signal from the RF input (i.e., main video, picture-in-picture, etc.) and the multiple signals may be displayed simultaneously if desired.

Figure 5:
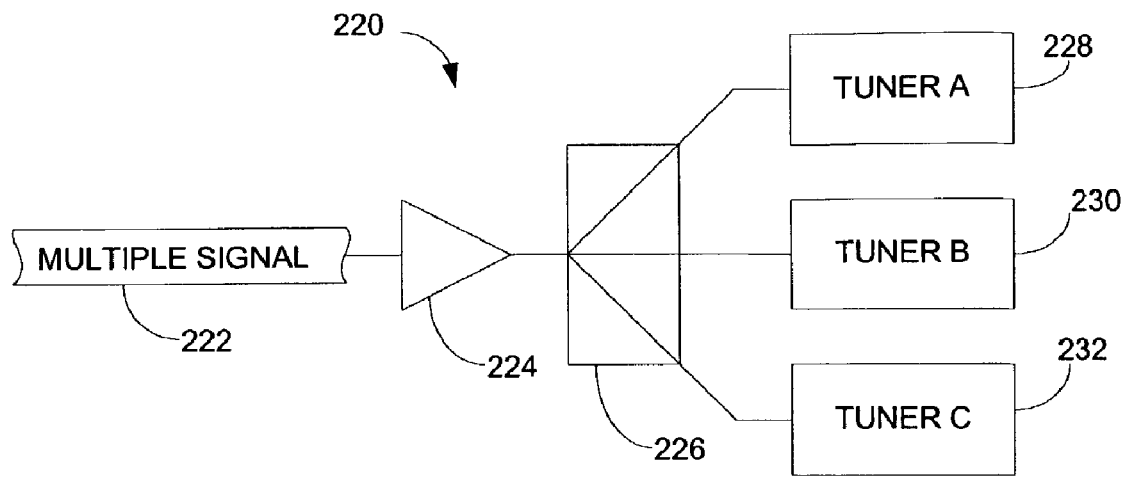
FIG. 5 is a block diagram illustrating a typical multi-tuner receiver.

A standard multi-tuner 220 is illustrated in FIG. 5. A single RF input line 222 comprising multiple signals at different frequencies is input to low noise amplifier (LNA) 224. The output of LNA 224 is fed to splitter 226, where the RF signal is split among multiple paths to tuners 228, 230 and 232.

Tuners 228, 230 and 232 each tune and amplify a different band (or possibly the same band) of the RF signal, permitting concurrent receipt and display of three (or more) signals at once. Alternatively, in a single tuner configuration, each desired RF signal band is received on an independent RF input and coupled to its own dedicated tuner. Tuner 150 of FIG. 2 is a single tuner configuration.

Since the front-end performance requirements for tuners 228, 230 and 232 differ, depending on their application, a fully integrated tuner with fixed performance specifications is not practical. Typically, the LNA in an integrated tuner design is either not integrated or not selectable. Where the LNA is not integrated, the LNA is chosen in order to optimize the particular receiver application. For instance, in a single signal reception environment an LNA with a certain specification is used, and in a multiple signal reception environment an LNA with a different specification is used. Where the LNA is integrated, conversely, it is not selectable. Hence, an LNA optimized for a single reception environment could not be bypassed in a multiple reception environment. Instead, a completely different tuner IC with a different LNA would be necessary.

Figure 6:
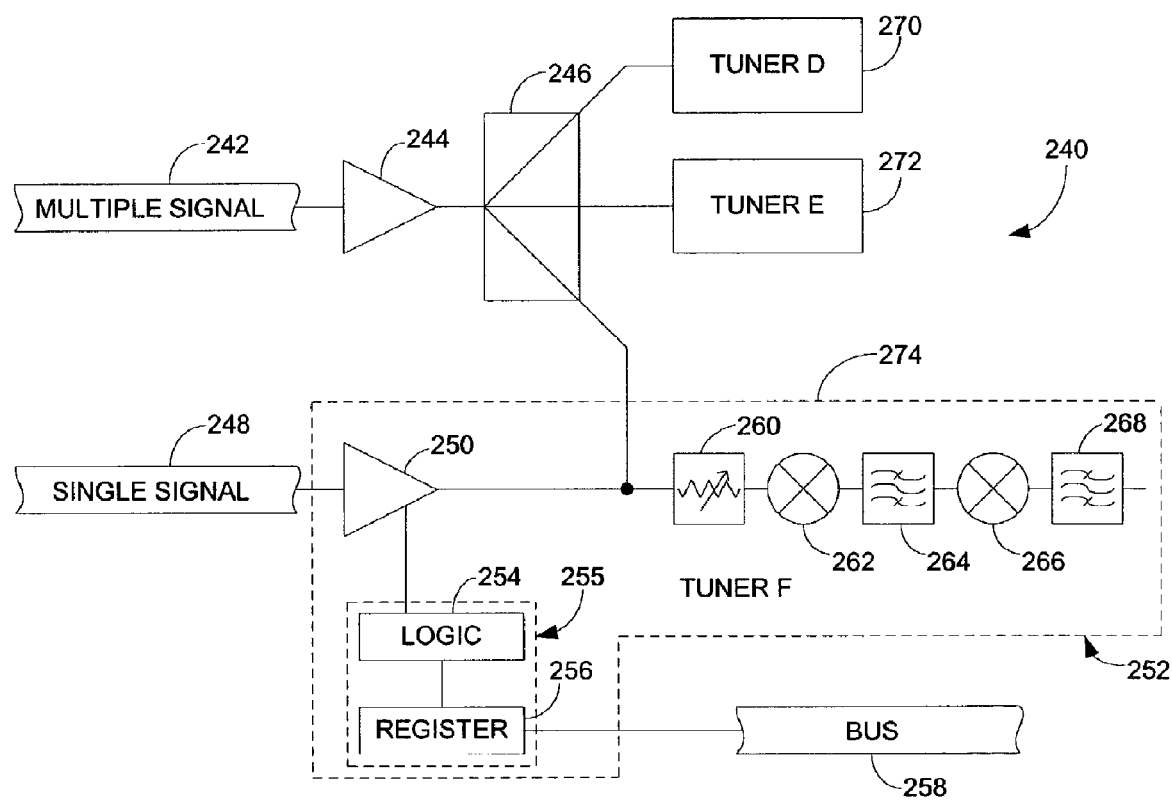
FIG. 6 is a block diagram illustrating a receiver configured for both multi-tuner and single-tuner operation according to the present invention.

FIG. 6 depicts another embodiment of the present invention. Receiver 240 is configured for both multiple and single signal reception, and includes an integrated and selectable LNA 250 to facilitate both types of reception. RF input 242 is provided for multiple signal reception, and RF input 248 is provided for single signal reception. Multi-signals appearing on RF input 242 are input to LNA 244 and splitter 246, where the multi-signal is split among multiple paths to tuners 270, 272 and 274. Each of tuners 270, 272 and 274 is optimized for a particular application (signal type).

Tuner 274 is integrated on a single IC 252. Although the components of tuner 274 are depicted only generally in FIG. 6, in one implementation, tuner 274 takes the same form as tuner 150 of FIG. 2. In this implementation, tuner 274 comprises an RF attenuator 260, a frequency up-conversion stage 262, a first IF filter 264, a frequency down-conversion stage 266, a second IF filter 268 and so on. Tuner 274 is configured to process signals from both multi-signal input 242 and single signal input 248. This is accomplished by injecting one of the split signals from splitter 246 into the signal path of tuner 274 following LNA 250. Multi/single tuner mode controller 255 controls the operation of LNA 250, depending on whether multi-signal input 242 or single signal input 248 is active.

Multi/single tuner mode controller 255 is coupled to LNA 250 and is controlled by an off-chip computer, processor or software via an interface with serial bus 258. In one implementation, mode controller 255 includes internal registers 256 whose values can be updated via serial bus 258 dependent on whether a multiple or single input signal is being received. Logic circuitry 254 coupled to registers 256 switches LNA 250 between on and off states based on the values stored in registers 256. This is just one embodiment of a tuner mode controller; alternative embodiments are possible and are within the scope of this invention.

Figure 7:
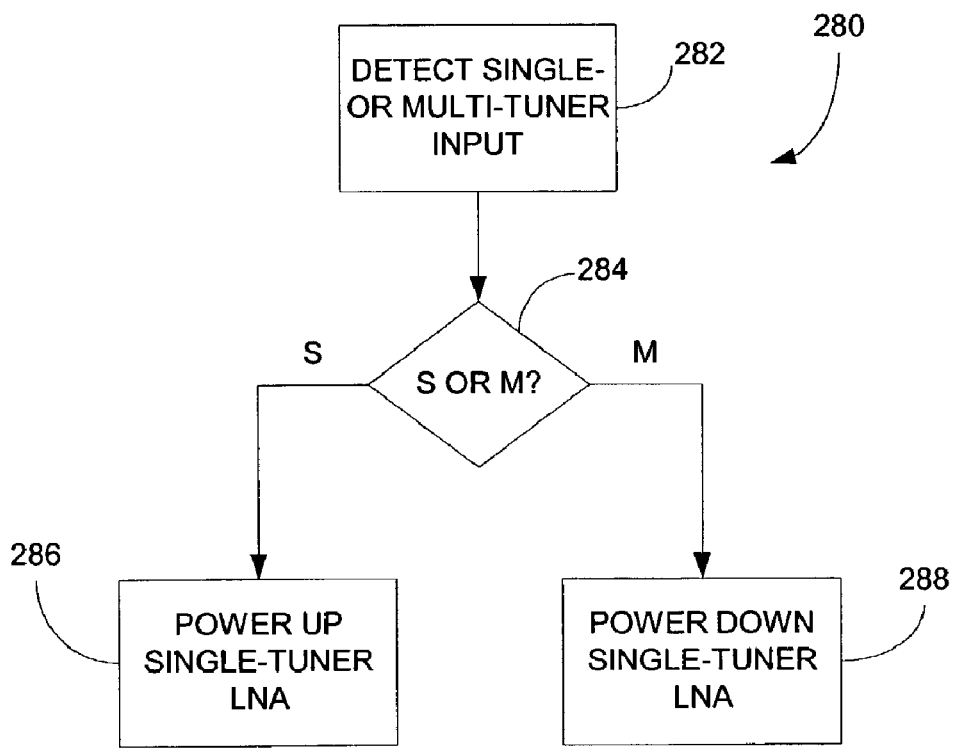
FIG. 7 is a flow chart illustrating a method for switching a receiver between multiple and single signal reception modes according to the present invention.

FIG. 7 illustrates a method 280 for switching receiver 240 between multiple and single signal reception modes according to the present invention. In step 282, the incoming signal type is detected. A controller or processor (not shown) determines whether a signal is present on multiple signal input 242 or on single signal input 248 and makes an appropriate output to serial bus 258. The signal type (multiple or single) is provided from serial bus 258 to tuner mode controller 255, with values corresponding to either multiple or single signal reception being stored in registers 256.

For single signal reception (step 284), mode controller 255 powers on LNA 250, which is optimized for single signal processing (step 286). The single signal present on RF input 248 is amplified by LNA 250 and then fed to the remaining components of tuner 274, beginning with RF attenuator 260. For multiple signal reception (step 284), mode controller 255 powers off LNA 250. The multi-signal present on RF input 242 is amplified by LNA 244, which is optimized for multi-signal processing, and is then injected into the remaining components of tuner 274, beginning with RF attenuator 260. Hence, during multi-signal reception, integrated LNA 250 is bypassed.

As previously described, LNA 250 and tuner 274 are integrated on IC 252. Hence, when only single tuner operation is required, component count can be saved by omitting the off-chip component LNA 244. With regard to the additional multi-tuner components, splitter 246 and/or tuners 270 and 272 may be integrated on IC 252, so that only selection and installation of an appropriate LNA 244 is required for multi-signal operation. Alternatively, to further save component count, all multi-tuner components may be omitted from IC 252 for single tuner operation, and provided as off-chip components when multi-tuner operation is required. When multiple tuners are required, the presence of LNA 250 is no disadvantage since it is powered off and bypassed.

The concepts embodied in tuner 150 (FIG. 2) and receiver 240 (FIG. 6) may be implemented in a single tuner component. That is, a single tuner IC may be provided that is capable of receiving an injected signal from a multi-tuner splitter. As in FIG. 6, the single tuner LNA is both integrated and selectable; it can be powered on for single tuner operation and powered off for multi-tuner operation. A tuner mode controller is provided to make the appropriate selection. In addition, an analog/digital mode controller may be provided to optimize the individual integrated components within the single tuner IC, as depicted and described with reference to FIG. 2. The tuner mode controller and analog/digital mode controller may be separate, or combined into one controller. The single tuner LNA, for example, might be powered on or off, depending on tuner mode, and when powered on, may be further optimized for analog or digital operation.

While various embodiments of the invention have been described, it will be apparent to those of ordinary skill in the art that many more embodiments and implementations are possible that are within the scope of this invention.

What is claimed is:

1. A tuner comprising:
   a plurality of tuner components configured to receive one of analog and digital input RF signals on a common input circuit and convert the signals to output IF signals;
   a data-storage circuit for storing parameters associated with various ones of the plurality of tuner components; and
   a controller configured to access and use the stored parameters to re-configure and switch the operation of at least one of the tuner components to
   an analog mode, and control the operation of the at least one of the tuner components at a high power level in response to detecting the receipt of an analog input RF signal, and
   a digital mode, and control the operation of the at least one of the tuner components at a low power level in response to detecting the receipt of a digital input RF signal.

2. The tuner of claim 1, wherein the tuner components include a low noise amplifier circuit, wherein the controller is configured to control the operation of the low noise amplifier circuit at a high power level in response to detecting an analog input RF signal, and to control the operation of the low noise amplifier circuit at a low power level in response to detecting a digital input RF signal.

3. A tuner comprising:
a plurality of tuner components configured to receive one of analog and digital input RF signals on a common input circuit and convert the signals to output IF signals; and
a controller configured to
control the operation of at least one of the tuner components at a high power level in response to detecting the receipt of an analog input RF signal, and
control the operation of the at least one of the tuner components at a low power level in response to detecting the receipt of a digital input RF signal;
wherein the tuner components include a low noise amplifier circuit, wherein the controller is configured to operate the low noise amplifier circuit in response to detecting a single-tuner input signal, and to power down the low noise amplifier circuit in response to detecting a multi-tuner input signal.

4. A tuner comprising:
a plurality of tuner components configured to receive one of analog and digital input RF signals on a common input circuit and convert the signals to output IF signals; the tuner components include a low noise amplifier circuit, and
a controller configured to
control the operation of at least one of the tuner components at a high power level in response to detecting the receipt of an analog input RF signal, and
control the operation of the at least one of the tuner components at a low power level in response to detecting the receipt of a digital input RF signal; and
route single-tuner input signals to the low noise amplifier circuit, and to route multi-tuner input signals to a different amplifier circuit.

5. The tuner of claim 1, further including a low noise amplifier circuit, wherein the controller is configured to control the operation of the low noise amplifier
at a high power level in response to detecting an analog single-tuner input RF signal,
at a low power level in response to detecting a digital single-tuner input RF signal, and
in a powered-down state in response to detecting a multi-tuner input RF signal.

6. The tuner of claim 1, further including a low noise amplifier circuit, wherein the controller is configured to control the operation of the low noise amplifier
at a high power level in response to detecting an analog single-tuner input RF signal,
at a low power level in response to detecting a digital single-tuner input RF signal, and
in a powered-down state in response to detecting no single-tuner input RF signal 7. The tuner of claim 1, wherein
the plurality of tuner components and the controller are integrated on an integrated circuit chip,
the tuner components include a converter circuit that converts the signal to an output IF signal, and
the controller is configured to operate the converter circuit at a high power level for converting an analog input RF signal, and to operate the converter circuit at a low power level for converting a digital input RF signal.

8. The tuner of claim 1,
wherein the tuner components include a low noise amplifier circuit,
further including an RF attenuator circuit configured to attenuate the output of the low noise amplifier circuit, and
wherein the controller is configured to control the RF attenuator at a high signal gain for attenuating a low-strength signal, and at a low signal gain for attenuating a high-strength signal.

9. The tuner of claim 1,
further including a mixer circuit configured to mix the input RF signal with another signal to convert the input RF signal to an IF signal,
wherein the controller is configured to supply a high bias current to the mixer for mixing analog input RF signals, and to supply a low bias current to the mixer for mixing digital input RF signals.

10. The tuner of claim 1, wherein the controller is configured to control parameters of at least one of the tuner components for supplying a high input bias current in response to an analog input RF signal and for supplying a low input bias current in response to a digital input RF signal.

11. A tuner circuit for receiving and processing analog and digital RF signals received on a common input, the circuit comprising:
an input signal detector configured to detect whether an input RF signal is an analog signal or a digital signal;
an amplifier circuit configured to amplify the input RF signal;
a converter circuit configured to convert the amplified RF signal to an output IF signal; and
a controller configured to
in response to detecting an analog input RF signal, controlling at least one of the amplifier circuit to operate at a high power and the converter circuit to operate at a high bias current, and
in response to detecting a digital input RF signal, controlling at least one of the amplifier circuit to operate at a low power and the converter circuit to operate at a low bias current.

12. The tuner circuit of claim 11, wherein the controller is configured to control the amplifier circuit to operate at a high power level in response to the detected input RF signal being an analog signal, and to control the amplifier circuit to operate at a low power level in response to the detected input RF signal being a digital signal.

13. The tuner circuit of claim 11, wherein the controller is configured to control the supply of a high bias current to the converter circuit in response to the detected input RF signal being an analog signal, and to control the supply of a low bias current to the converter circuit in response to the detected input RF signal being a digital signal.

14. The tuner circuit of claim 11, wherein the controller is configured to
in response to the detected input RF signal being an analog signal, control the amplifier circuit to operate at a high power level and control the supply of a high bias current to the mixer circuit, and
in response to the detected input RF signal being a digital signal, control the amplifier circuit to operate at a low power level and control the supply of a low bias current to the mixer circuit.

15. The tuner circuit of claim 11, wherein the controller is configured to control the amplifier circuit in a power off state in the absence of a single-tuner input signal.

16. The tuner circuit of claim 11,
further including a memory circuit that stores variables for use by the controller in controlling the operation of at least one of the amplifier circuit and the converter circuit, the variables including a first set of variables for use in processing analog input RF signals and a second set of variables for use in processing digital input RF signals, and
wherein the controller is a programmable controller that is configured to
in response to the detected input RF signal being an analog signal, retrieve and use the first set of stored variables control the operation of the at least one of the amplifier circuit and the converter circuit, and
in response to the detected input RF signal being a digital signal, retrieve and use the second set of stored variables control the operation of the at least one of the amplifier circuit and the converter circuit.

17. A multimedia receiver for receiving multiple analog and digital input RF signals from a broadband network, the receiver comprising:
an input circuit configured to receive the analog and digital input signals;
a multi-tuner amplifier circuit configured to amplify received multi-tuner input signals;
a single-tuner amplifier circuit configured to amplify received single-tuner input signals;
an RF attenuator circuit configured to attenuate the amplified output of the single-tuner amplifier circuit;
a mixer circuit configured to mix the attenuated output of the RF attenuator circuit to generate an IF signal;
a controller configured to
control the operation of the single-tuner amplifier circuit at a high power level to amplify analog input signals,
control the operation of the single-tuner amplifier circuit at a low power level to amplify digital input signals,
operate the RF attenuator circuit at a high signal gain for attenuating a low-strength signal,
operate the RF attenuator circuit at a low signal gain for attenuating a high-strength signal,
supply a high bias current to the mixer circuit for mixing analog input RF signals, and
supply a low bias current to the mixer circuit for mixing digital input RF signals.

\* \* \* \* \*